United States Patent
Cok et al.

(10) Patent No.: US 7,341,886 B2
(45) Date of Patent: Mar. 11, 2008

(54) APPARATUS AND METHOD FOR FORMING VIAS

(75) Inventors: Ronald S. Cok, Rochester, NY (US); Timothy J. Tredwell, Fairport, NY (US); Dustin L. Winters, Webster, NY (US); Andrea S. Rivers, Bloomfield, NY (US); Michael L. Boroson, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 305 days.

(21) Appl. No.: 11/071,702

(22) Filed: Mar. 3, 2005

(65) Prior Publication Data

US 2006/0199475 A1    Sep. 7, 2006

(51) Int. Cl.
*H01L 51/40* (2006.01)
*H01L 21/469* (2006.01)

(52) U.S. Cl. .............. 438/99; 438/759; 438/780; 438/781; 257/E21.577

(58) Field of Classification Search .............. 438/99, 438/780, 781, 759
See application file for complete search history.

(56) References Cited

U.S. PATENT DOCUMENTS

| | | | |
|---|---|---|---|
| 5,534,071 A * | 7/1996 | Varshney et al. | 118/726 |
| 5,814,417 A | 9/1998 | Nagayama | |
| 6,136,622 A | 10/2000 | Fukuzawa et al. | |
| 6,214,651 B1 * | 4/2001 | Cox | 438/141 |
| 6,629,375 B2 | 10/2003 | Mallsion et al. | |
| 6,683,277 B1 | 1/2004 | Millard et al. | |
| 6,692,094 B1 | 2/2004 | Cok | |
| 6,797,919 B1 | 9/2004 | Millard et al. | |
| 2004/0051446 A1 | 3/2004 | Werner et al. | |
| 2004/0253756 A1 | 12/2004 | Cok | |

FOREIGN PATENT DOCUMENTS

WO    WO9903157    1/1999

* cited by examiner

*Primary Examiner*—Scott B. Geyer
*Assistant Examiner*—Seahvosh Nikmanesh
(74) *Attorney, Agent, or Firm*—Frank Pincelli (57) ABSTRACT

A method and apparatus for forming vias in one or more layers, comprising providing a vacuum chamber, one or more beams in the vacuum chamber. The array of directed beams located in alignment with a layer for ablating one or more areas of the layer for forming vias. A cold trap is also provided in the vacuum chamber that is in fixed alignment with respect to the one or more beams such that the ablated material condenses upon the cold trap at the time and location when the one or more vias is being formed.

31 Claims, 11 Drawing Sheets

APPARATUS AND METHOD FOR FORMING VIAS

FIELD OF THE INVENTION

The present invention relates to organic light-emitting diode (OLED) devices and, more particularly, to an apparatus for making an OLED device with improved yields.

BACKGROUND OF THE INVENTION

Organic light-emitting diode (OLED) devices, also referred to as organic electro-luminescent (EL) devices, have numerous well-known advantages over other flat-panel display devices currently in the market place. Among these advantages are brightness of light emission, relatively wide viewing angle, and reduced electrical power consumption compared to, for example, liquid crystal displays (LCDs) using back-lighting.

Applications of OLED devices include active-matrix image displays, passive-matrix image displays, and area lighting devices such as, for example, selective desktop lighting. Irrespective of the particular OLED device configuration tailored to these broad fields of applications, all OLEDs function on the same general principles. An organic electro-luminescent (EL) medium structure is sandwiched between two electrodes. At least one of the electrodes is light transmissive. These electrodes are commonly referred to as an anode and a cathode in analogy to the terminals of a conventional diode. When an electrical potential is applied between the electrodes so that the anode is connected to the positive terminal of a voltage source and the cathode is connected to the negative terminal, the OLED is said to be forward-biased. Positive charge carriers (holes) are injected from the anode into the EL medium structure, and negative charge carriers (electrons) are injected from the cathode. Such charge carrier injection causes current flow from the electrodes through the EL medium structure. Recombination of holes and electrons within a zone of the EL medium structure results in emission of light from this zone that is, appropriately, called the light-emitting zone or interface. The emitted light is directed towards an observer, or towards an object to be illuminated, through the light-transmissive electrode. If the light-transmissive electrode is between the substrate and the light-emissive elements of the OLED device, the device is called a bottom-emitting OLED device. Conversely, if the light-transmissive electrode is not between the substrate and the light-emissive elements, the device is referred to as a top-emitting OLED device.

The organic EL medium structure can be formed of a stack of sub-layers that can include small molecule layers and polymer layers. Such organic layers and sub-layers are well known and understood by those skilled in the OLED art.

Because light is emitted through an electrode, it is important that the electrode through which light is emitted be sufficiently light transmissive to avoid absorbing the emitted light. Typical prior-art materials used for such electrodes include indium tin oxide (ITO) and very thin layers of metal. However, the current-carrying capacity of electrodes formed from these materials is limited, thereby limiting the amount of light that can be emitted from the organic layers.

In top-emitting OLED devices, light is emitted through an upper electrode or top electrode which has to be sufficiently light transmissive, while the lower electrode(s) or bottom electrode(s) can be made of relatively thick and electrically conductive metal compositions which can be optically opaque.

In conventional integrated circuits, bus connections are provided over the substrate to provide power to circuitry in the integrated circuit. These busses are located directly on the substrate or on layers deposited on the substrate, for example on planarization layers. In complex circuits, multiple levels of bus lines are located over the substrate and separated by insulating layers of material. For example, OLED displays sold by the Eastman Kodak Company utilize multiple bus lines located on the substrate and on various planarization layers. However, these busses are not useful to provide power to the light transmissive upper electrode in an OLED device because conventional photolithographic techniques destroy the organic layers and thin upper electrode necessary for a top-emitting OLED device.

Co-pending, commonly assigned US Publication No. 2004/0253756, published Dec. 16, 2004, entitled "Method of Making a Top-Emitting OLED Device having Improved Power Distribution" proposes to solve this problem by employing a method of making a top-emitting OLED device that includes providing over a substrate laterally spaced and optically opaque lower electrodes and upper electrode busses which are electrically insulated from the lower electrodes; depositing an organic EL medium structure over the lower electrodes and the upper electrode busses; selectively removing the organic EL medium structure over at least portions of the upper electrode busses to reveal at least upper surfaces of the upper electrode busses; and depositing a light transmissive upper electrode over the organic EL medium structure so that such upper electrode is in electrical contact with at least upper surfaces of the upper electrode busses. This method will effectively provide power to the upper electrode. However, the selectively removed organic EL material may re-deposit in other areas of the EL medium structure.

In any ablative system, there is a problem with removal of the ablated material, which is formed as a plume of smoke and debris. It is possible for the generated debris to deposit, for example, on the optics or internal surfaces of the laser ablation apparatus, or on the substrate or ablated layers themselves. The collection of such debris on the optics would result in a reduction in the energy that the imaging device was able to deliver to the ablation medium, which could potentially give rise to underexposure and loss of ablating capability. Furthermore, the airborne ablated particles and fumes are likely to give rise to various environmental issues and health and safety hazards. It is clearly necessary to provide means by which such ablation debris may be satisfactorily controlled.

Several means for the collection of ablation debris are already known from the published literature. Typically, an extraction apparatus is provided which comprises a vacuum head for collection of the ablated debris at the point at which it is generated, and a length of ducting to transport the collected debris from the vacuum head to a gas-particle separator device that removes and collects the ablated particles from the effluent gas. For example, U.S. Pat. No. 6,629,375B2 entitled "Apparatus for collecting ablated material" issued Oct. 7, 2003, US20040051446 A1 entitled "Method and apparatus for structuring electrodes for organic light-emitting display and organic light-emitting display manufactured using the method and apparatus" published Mar. 18, 2004, W09903157 entitled "Laser Ablation Method to Fabricate Color Organic Light Emitting Diode Displays" published Jan. 21, 1999, and U.S. Pat. No. 6,683,277 B1 and U.S. Pat. No. 6,797,919 B1 both entitled "Laser ablation nozzle assembly" and issued Jan. 27, 2004 and Sep. 28, 2004 respectively, describe laser ablation systems having a variety of nozzle designs, filtering methods, and mechanical arrangements.

However, such apparatus generally suffers from problems associated with the deposition of collected debris that can severely impair efficiency, and the incorporation of additional, remedial, features is often necessary in order to alleviate these difficulties. Moreover, these apparatuses operate only in an atmosphere whereas many deposition and process manufacturing steps are carried out in a vacuum. In many production processes, for example those used for OLED device manufacturing, materials are deposited in a vacuum chamber and it is inconvenient or detrimental to place the device in a laser ablation chamber having an atmosphere suitable for an extraction apparatus as described in the prior art.

There is a need, therefore for an improved method and apparatus for selectively removing material from a surface at an improved rate and with reduced contamination in a vacuum chamber.

SUMMARY OF THE INVENTION

In accordance with one aspect of the present invention there is provided an apparatus for forming vias in one or more layers, comprising:

a) a vacuum chamber a) one or more beams in the vacuum chamber, the array of directed beams located in alignment with a layer for ablating one or more areas of the layer for forming vias; and b) a cold trap in the vacuum chamber, the cold trap being in fixed alignment with respect to the one or more beams such that the ablated material condenses upon the cold trap at the time and location when the one or more vias is being formed.

In accordance with another aspect of the present invention there is provided a method of making an OLED device comprising the steps of:

a) providing a substrate;

b) forming one or more first electrodes and electrode busses on the substrate;

c) forming one or more organic layers over the first electrodes and electrode busses;

d) ablating a plurality of areas of the material layer for forming vias using at least one beam in a chamber; and e) collecting the ablated material with a cold trap having a trap, wherein the cold trap is located in close proximity to the plurality of areas at the time of ablation so that a collection force is applied to the debris formed during ablation of the material.

In accordance with yet another aspect of the present invention there is provided a method for forming vias in one or more layers, comprising:

a) forming one or more vias in one or more areas of the layers using one or more beams located in alignment with the layers; and b) collecting ablated material caused by the directed beams forming the one or more vias using a cold trap wherein the cold trap is in fixed alignment with respect to the one or more beams such that the cold trap applies a removal force on the ablated material at the time and location when the one or more vias is being formed.

These and other aspects, objects, features and advantages of the present invention will be more clearly understood and appreciated from a review of the following detailed description of the preferred embodiments and appended claims and by reference to the accompanying drawings.

BRIEF DESCRIPTION OF THE DRAWINGS

In the detailed description of the preferred embodiments of the invention presented below, reference is made to the accompanying drawings in which:

FIG. 4 is a close-up perspective view of the embodiment of FIG. 3a;

The drawings are necessarily of a schematic nature since layer thickness dimensions are frequently in the sub-micrometer ranges, while features representing lateral device dimensions can be in a range from 10 micrometer to several meters. Accordingly, the drawings are scaled for ease of visualization rather than for dimensional accuracy.

DETAILED DESCRIPTION OF THE INVENTION

The present invention is directed to an apparatus and method for making vias through the organic layers of OLED devices but may be employed in any system requiring the ablation of layers of material formed on a substrate.

Figure 1:
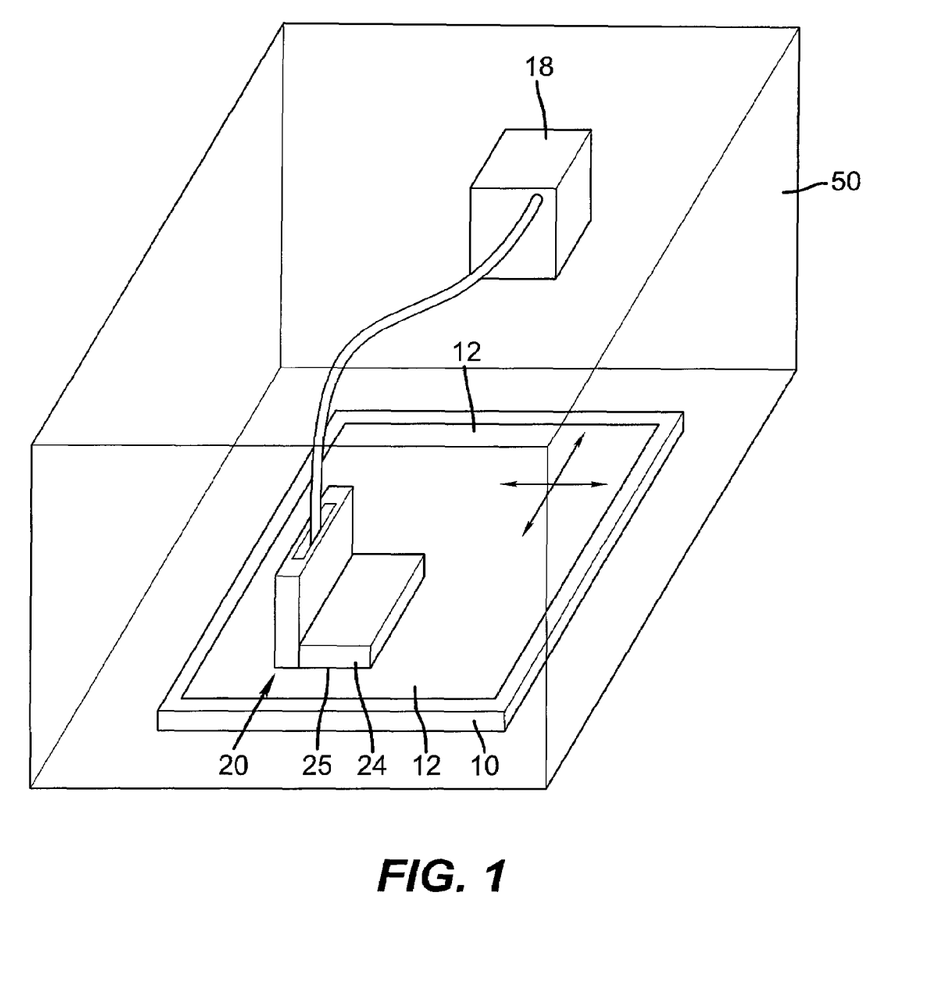
FIG. 1 is a perspective view of an apparatus according to one embodiment of the present invention.

Referring to FIG. 1, an apparatus for forming vias in one or more layers according to one embodiment of the present invention comprises a vacuum chamber, one or more beams in the vacuum chamber and located in alignment with a layer 12 for ablating one or more areas of the layer 12 for forming vias 30; and a cold trap 24 in the vacuum chamber, said cold trap 24 being in fixed alignment with respect to the one or more beams such that the ablated material condenses upon said cold trap 24 at the time and location when said one or more vias 30 is being formed. The layer 12 may be formed upon a substrate 10 and the one or more beams may be formed in an array. The beams and the cold trap 24 may be formed in a common head 20 and located in a vacuum chamber 50 or a chamber 50 having an atmosphere. The beams may be created in a beam-forming device 18 external to the vacuum chamber and conducted to the head 20 or, alternatively, the beams may be created within the head 20. The head 20 and substrate 10 may move relative to each other in at least two dimensions, as indicated by the arrows in FIG. 1.

Ablated material adheres to the surface 25 of cold trap 24. The surface 25 may be coated with an adhesive chemical layer or may interact chemically with any material that deposits thereon. Alternatively or additionally, the surface 25 may be kept at a temperature lower than that of the material layers 12 so that any ablated material that comes in contact with the surface 25 condenses thereon.

Figure 2:
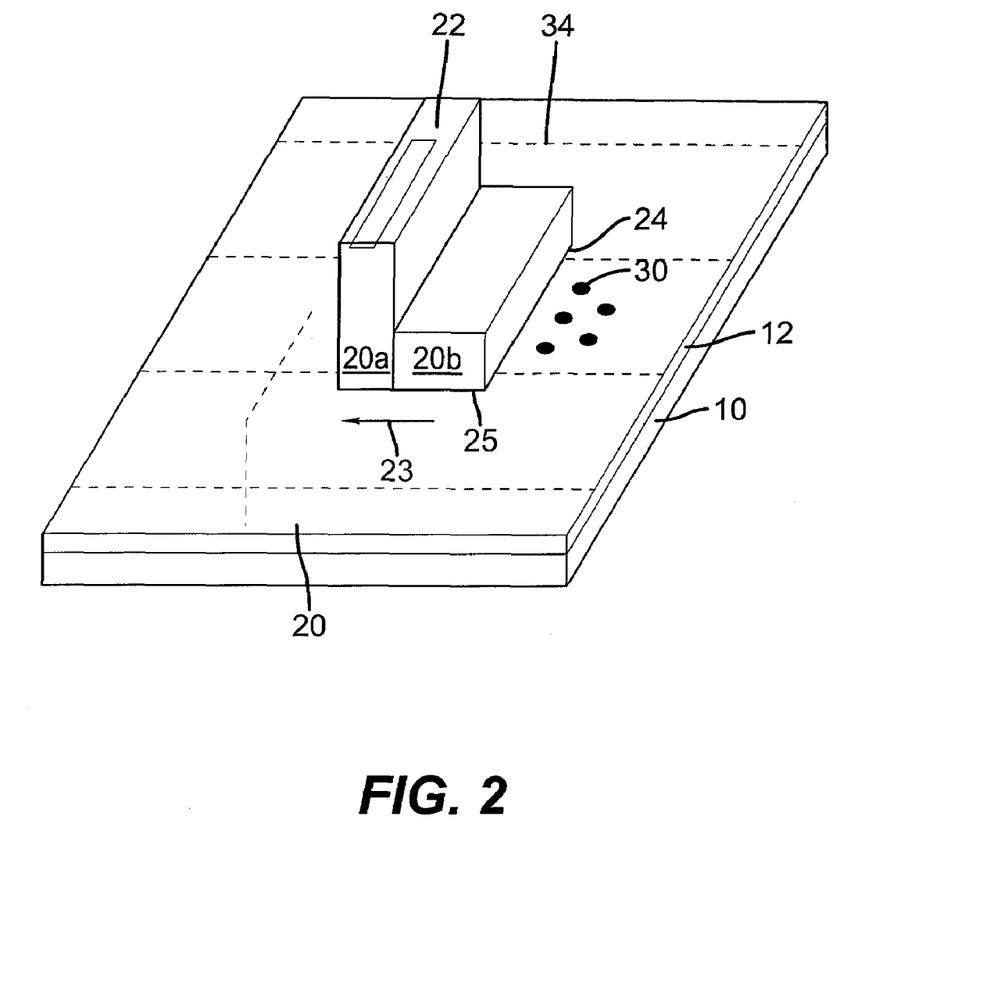
FIG. 2 is an enlarged perspective view of a portion of the apparatus of FIG. 1.

Referring to FIG. 2, the head 20 may comprise two portions located in fixed alignment. The first beam portion 20a directs the beams from an external source (not shown in FIG. 2) through a beam port 22 in the head 20. The second cold trap portion 20b traps the ablated material by causing it to adhere to the cold trap surface 25. As shown in this embodiment, the beam portion 20a and cold trap portion 20b are formed in a common head 20. Each beam is independently controlled to enable the ablation of material in desired locations. The head 20 travels across the substrate 10 and layers of material 12 as indicated by the arrow 23 to selectively remove material at desired locations and form vias 30 in the material layer 12. The head 20 may not be as large or have enough beams to create all the needed vias 30 at the desired resolution in one pass across the substrate 10, so the head 20 may make multiple offset passes across the surface of the substrate 10 to selectively remove portions of the material layers 12 one swathe 34 at a time. The head 20 may move relative to the substrate 10 in two dimensions and in alignment with the substrate 10 and material layers 12 to selectively remove material in precisely the desired locations. The head 20 may move while the substrate 10 is fixed in position or, alternatively, the substrate 10 may move while the head 20 is fixed in position, in the same or different dimensions. The head 20 may also move up or down relative to the substrate 10 to aid in locating the head 20 and array of beams relative to the material layers 12. In yet another alternative, both the substrate 10 and the head 20 may move together. Preferably, the beam portion 20a will move ahead of the cold trap portion 20b in the direction of travel so that the cold trap 24 will move toward the ablated material as the head 20 translates across the surface of the substrate 10.

Figure 3A:
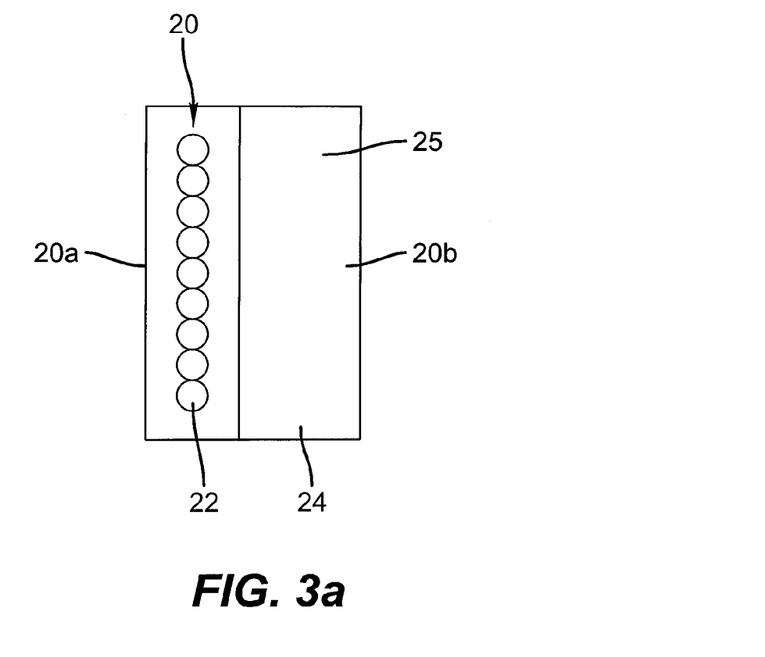
FIGS. 3a and 3b are bottom views of alternative embodiments of a head according to the present invention.
Figure 3B:
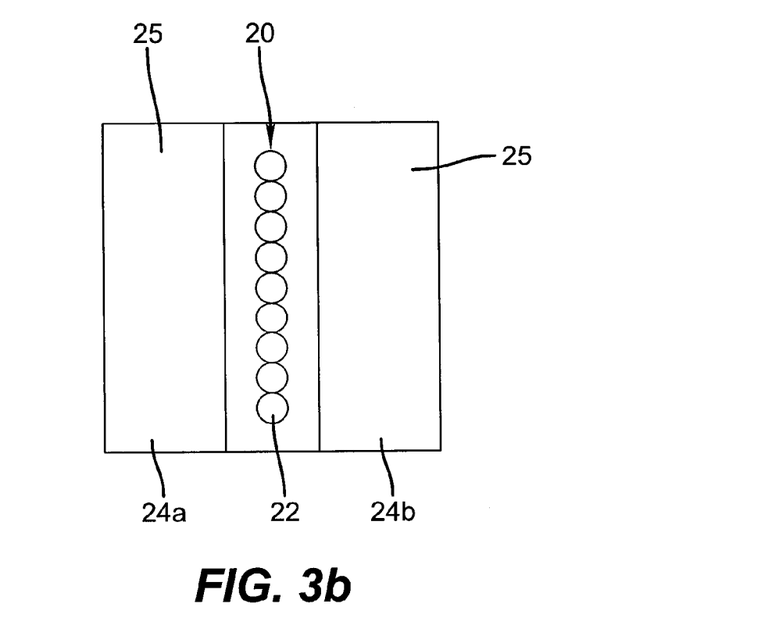
Figure 3C:
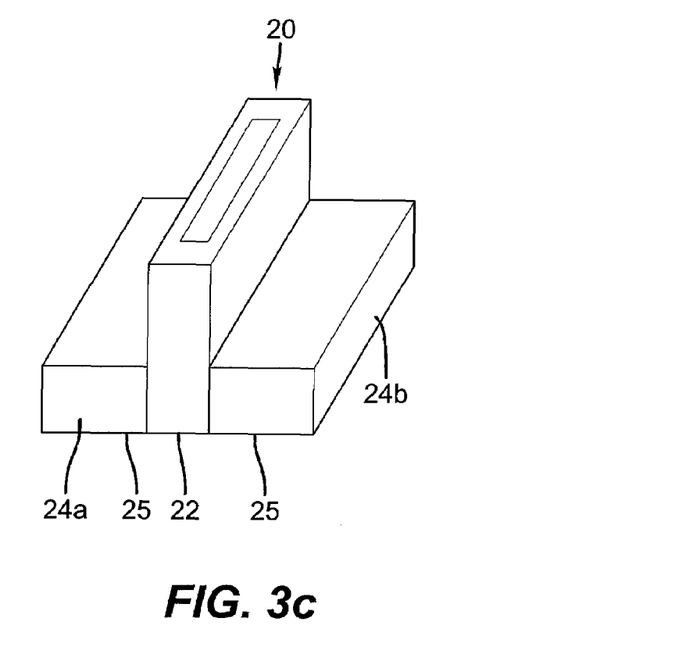
FIG. 3c is a perspective view of the head of FIG. 3b.
Figure 3D:
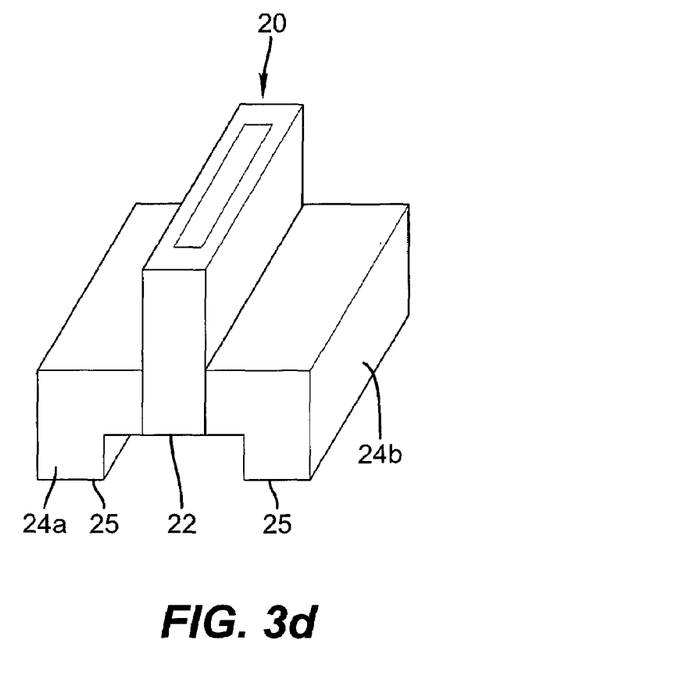
FIG. 3d is a perspective view of an alternative trap arrangement.

FIGS. 3a and 3b illustrate bottom views of two alternative embodiments of the present invention. Referring to FIG. 3a, the head 20 includes one or more beam ports 22 for emitting one or more beams. The cold trap 24 has an extent slightly larger than the extent of the beam ports 22. It is desirable that the cold trap 24 be longer in length than the extent of the beam ports 22 so as to capture debris created by the periphery of the beams. The cold trap 24 may be rectangular (as shown) or take a variety of shapes. Referring to FIG. 3b, the head 20 may move bi-directionally and includes beam port 22 and a cold trap 24 adjacent to all of the beams of the beam port 22 and in close association with them on both sides. Referring to FIG. 3c, in a perspective view of FIG. 3b, the head 20 includes a cold trap 24 on either side of the beam port 22. Referring to FIG. 3d, the surface 25 need not be flat but may comprise a plurality of surfaces at different angles to each other. In this case as, the head 20 is further from the material layers 12 than the cold traps 24a and 24b so that, as the head 20 moves over the material layers, the cold traps sweep through the volume of space into which the ablated material is ejected.

Figure 4:
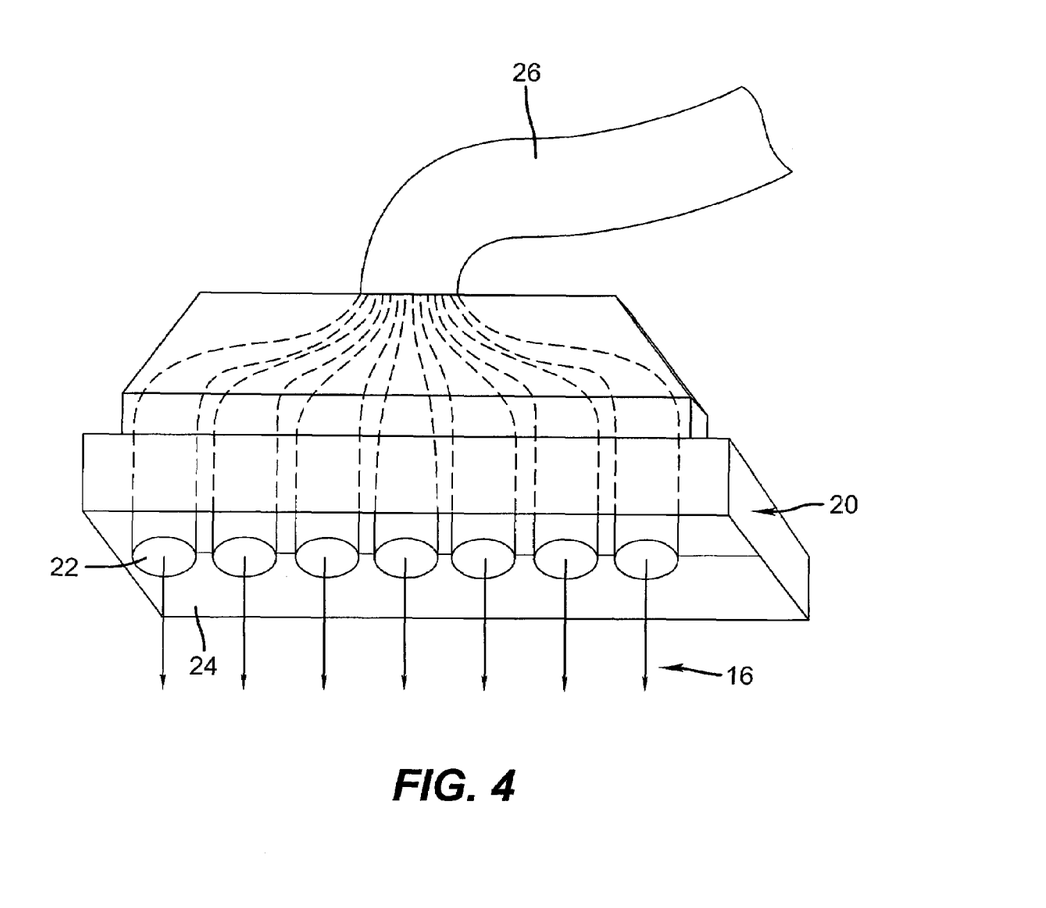

Referring to FIG. 4, in a more detailed perspective view of one embodiment of a head 20, the beams 16 may be provided through one or more beam ports 22 fed from a cable 26 of one or more fibers. In this embodiment, the beams may be laser beams generated externally to the chamber 50 in a beam-forming device 18 (shown in FIG. 1). However, the present invention is not limited to this case, and the beams may also be laser beams generated internally to the chamber. Also, the use of a fiber for directing the beam is not always required for successful practice of the present invention.

Figure 5:
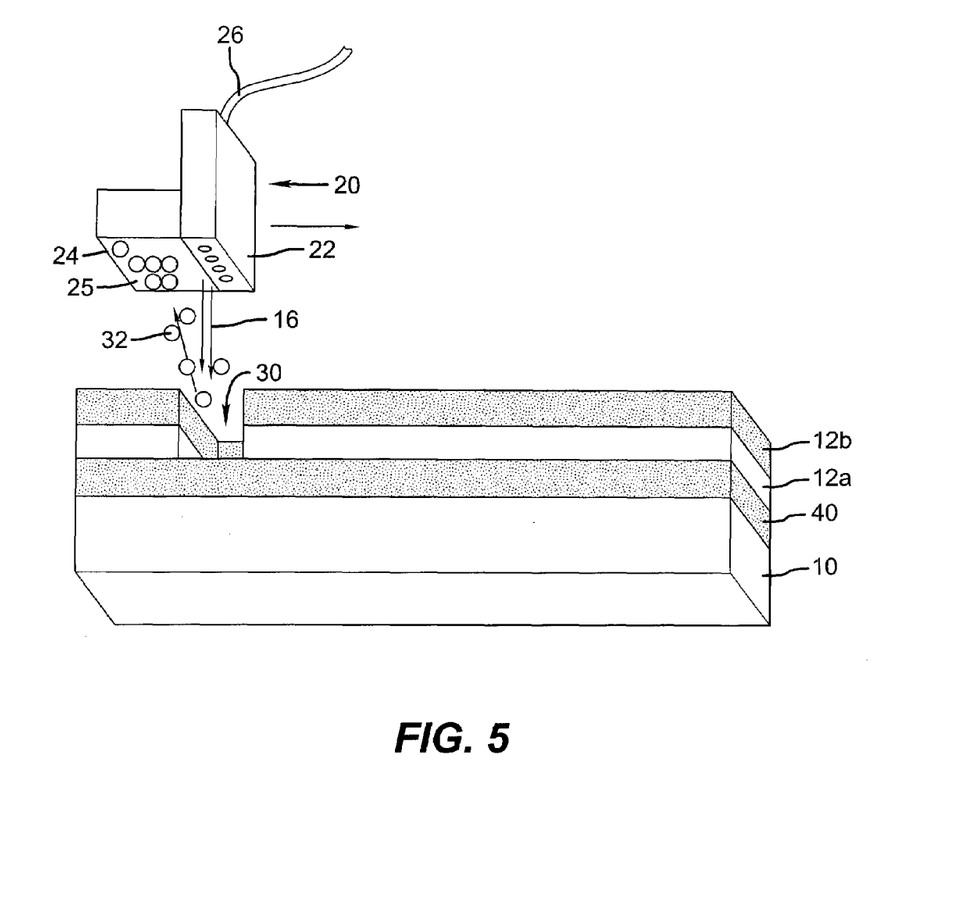
FIG. 5 is a perspective view of one embodiment of the present invention employed to ablate material from a substrate having a beam portion and a trap portion on the same side of a substrate.

FIG. 5 illustrates one embodiment of the present invention in operation. Referring to FIG. 5, a substrate 10 has a first metal electrode 40 formed over the substrate 10. Two material layers 12a and 12b are deposited over the electrode 40. A head 20 located in alignment with the substrate 10 and material layers 40, 12a, and 12b and having beam ports 22 and a cold trap 24 forms a plurality of beams 16 that ablate vias 30 in material layers 12a and 12b. The beams 16 may be formed externally to the chamber 50 and are switched on or off to ablate material 32 at the desired locations only. The ablated material 32 adheres to the cold trap 24. The electrode layer 40 is not ablated because it does not absorb the beam and is more robust in the presence of a beam 16. The layer 40 may include additional coatings intended to assist in ablating the material layers above it, for example materials chosen to absorb the energy from the beams and heat the material layers.

Figure 6:
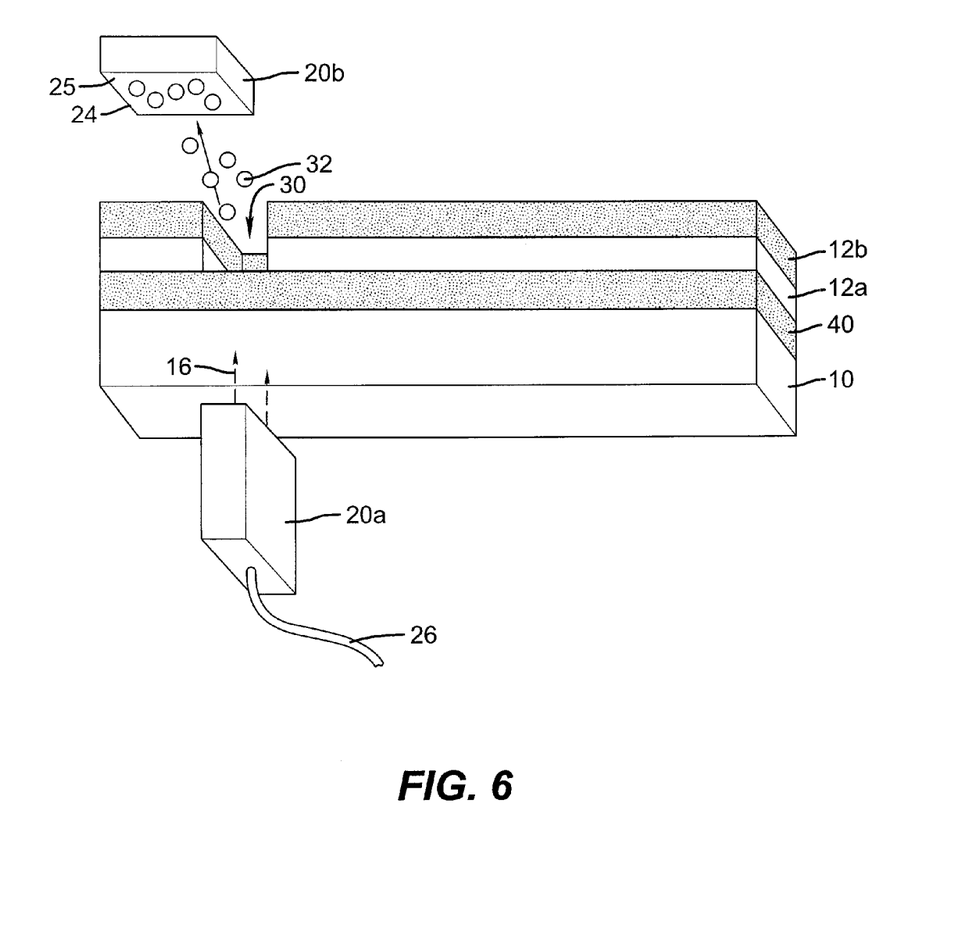
FIG. 6 is a perspective view of an alternative embodiment of the present invention employed to ablate material from a substrate having a beam portion and a trap portion on opposite sides of a substrate.

The embodiment of FIG. 5 uses an array of beams 16 that pass into the material layers 12a and 12b to be ablated without passing through the substrate 10. In an alternative embodiment, the beams 16 may pass through the substrate 10. Referring to FIG. 6, the beam ports 22 and the cold trap 24 are held in fixed alignment but are not formed in a common head. The directed beams 16 are emitted from the beam ports in the beam portion 20a and pass through the substrate 20. In this case, the substrate may be transparent to the beams 16 and any underlying layers (such as electrode 40) before striking the material layers 12a and 12b to be ablated. Alternatively, the electrode 40 may not be transparent and may be heated by the beams and thereby cause the material to ablate. The trap 24 adheres the ablated material 32 so that it is not re-deposited on the material layer but is trapped on the surface 25. In either the configuration of FIG. 5 or FIG. 6, the beam portion 20a and trap portion 20b are in fixed alignment and are moved relative to the substrate 10 and under common control with the beams 16 to ablate only the areas desired.

The present invention improves the throughput of any ablating via-formation system by providing a plurality of beams that can ablate material at the same time. Since the present invention may be employed in manufacturing display devices such as OLED displays, and since a via may be needed for every pixel in a display, a large number of vias may be necessary, for example more than 10,000. The present invention also reduces the possibility of contamination due to re-deposition of ablated material by locating traps in alignment with the ablating beams and close to the location of material ablation.

The chamber 50 may be evacuated or, alternatively, may have an atmosphere inert to the directed beams and to the material layers so that additional by-products of the ablation process are avoided. For example, nitrogen, argon, or helium may be employed.

The directed beams of the present invention may be optical beams. A variety of frequencies may be employed (for example, visible, infrared or ultraviolet). The frequencies chosen are selected to optimize the ablation of material and are typically absorbed by the material or any absorptive coating underlying the layers of material to be ablated. If material exposure is performed through the substrate, the substrate should be largely transparent to the frequencies employed. Exposure may also be made by any underlying substrate carrier that is transparent, or has a window that is transparent, to the frequencies employed. If the chamber 50 has a window that is transparent to the frequencies employed, the exposure may also be performed through the window.

While any optical beam of sufficient energy may be employed to ablate the layers of material to form vias, laser beams may be advantageously utilized. Optical fibers capable of transferring laser beams effectively from one location to another are well known, as are optical elements for focusing the beams, solid-state means to generate the laser light, and electronic controls for controlling the generation and intensity of laser light, thereby enabling the ablation of material at the desired locations only. The beams may be formed in a common integral optical head, as shown, or may comprise separate elements located in alignment. Optical elements may be employed to focus the beams onto the desired location with a spot size and shape of the desired size and shape.

The substrate 10 may be oriented vertically in the vacuum chamber 50 to assist in preventing ablated material from re-depositing and contaminating the surface of the material layers. In this configuration the top surface of the substrate 10 containing the material layers is disposed approximately 90 degrees to the force of gravity. In this orientation, the head 20 may move upward so that ablated material will tend to fall in the direction of the cold trap 24. Such an orientation is also preferred so as to reduce curvature of the substrate 10 with respect to gravity to facilitate location of the beam with respect to the selected areas of material to be removed. Alternatively, the substrate 10 may be located horizontally with the layers of material to be ablated located below the substrate so that any ablated material will fall away from the substrate 10 and layers 12 of material. Alternately the substrate 10 may be orientated at an angle between the horizontal and vertical positions described. Finally, some advantage may still be achieved by orientating the substrate at an angle greater than 90 degrees with respect to the force of gravity to as much as 100 degrees.

Figure 7:
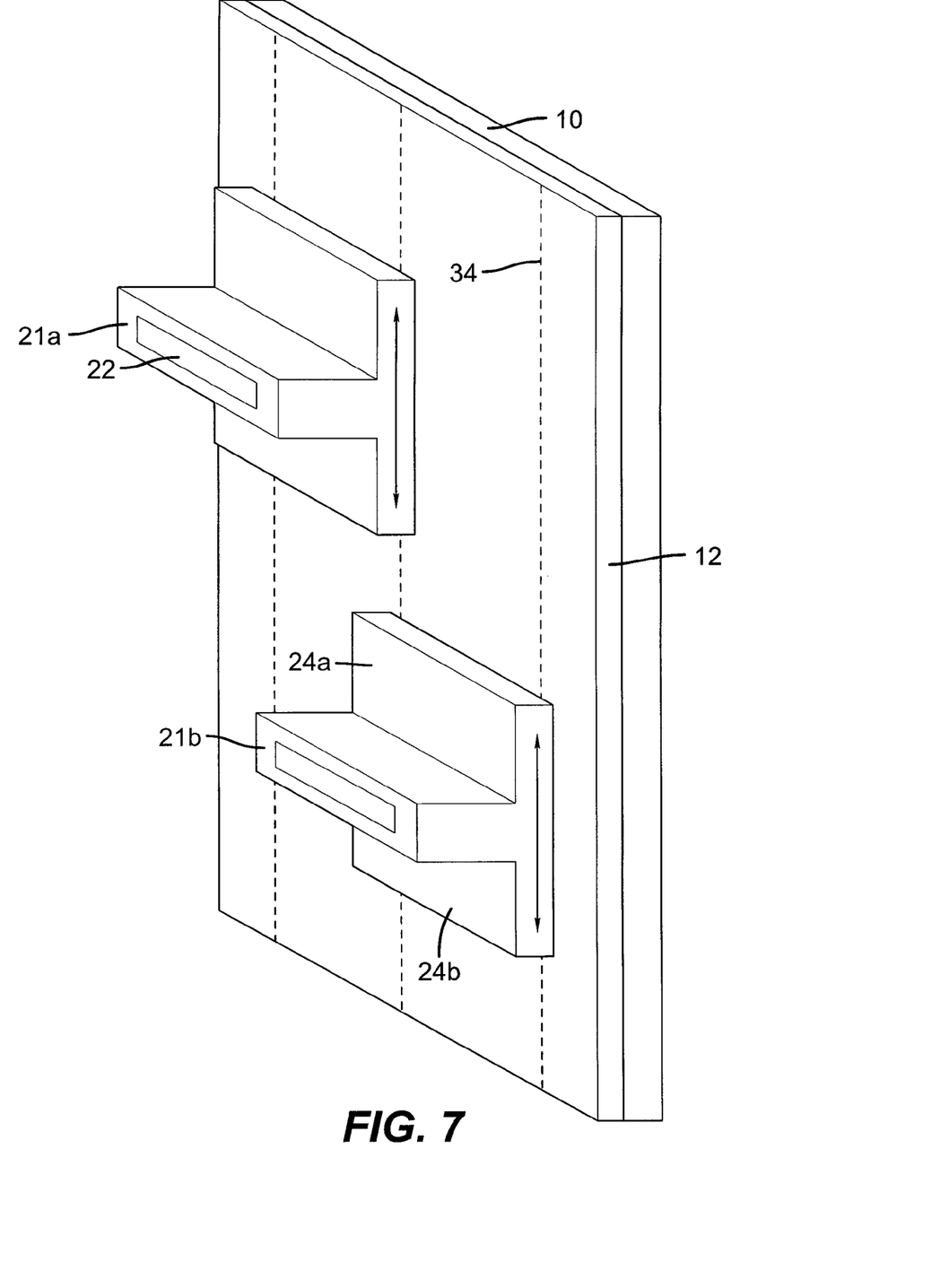
FIG. 7 is a perspective view of an alternative embodiment of the present invention having a vertical orientation and a bi-directional head.

Referring to FIG. 7, the substrate 10 is oriented vertically. In this embodiment, a plurality of bi-directional heads 21a and 21b are illustrated. Each head 21a and 21b is located in strict alignment with each other so as to ablate material in adjacent, aligned swathes 34. The heads 21a and 21b can move bi-directionally so that vias may be made at higher resolution or a higher throughput achieved. To enable this bi-directional movement, an additional cold trap 24b is provided on the side of the optical port 22 opposite a first cold trap 24a. As the substrate 10 and heads 21a and 21b move relative to each other, one cold trap may not be employed. For example, as the heads 21a and 21b move upward, the cold trap 24a may not be employed while cold trap 24b is employed. Likewise, when the heads 21a and 21b move downward, the cold trap 24b may not be employed while cold trap 24a is employed. This bi-directional configuration may be applied when the substrate 10 is at any angle and is not restricted to use in the vertical orientation shown in FIG. 7. Moreover, both cold traps 24a and 24b may be used together to provide improved debris collection.

Figure 8:
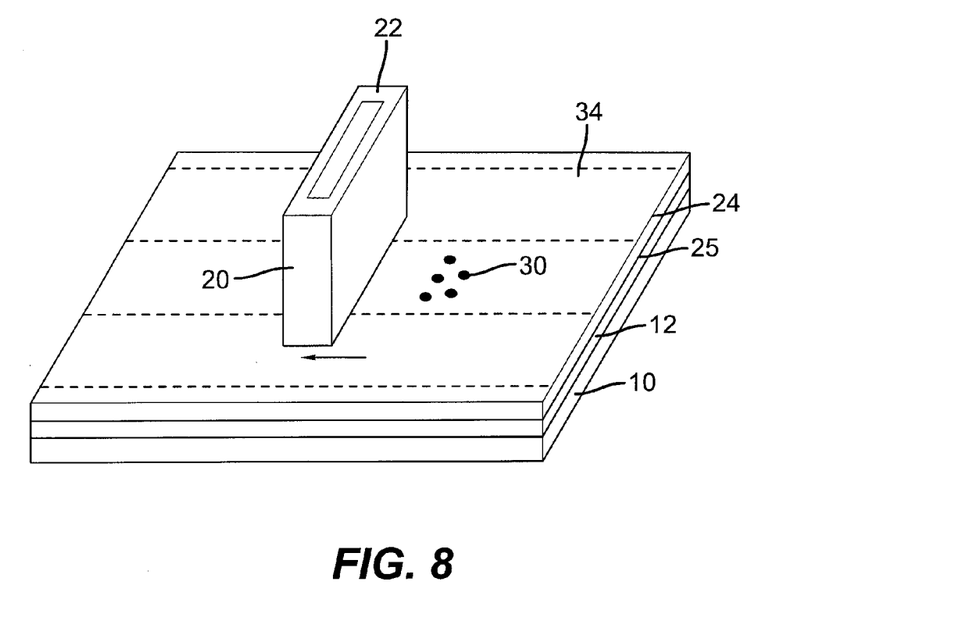
FIG. 8 is a perspective view of an alternative embodiment of the present invention having a trap located over the substrate and material layers.

According to various embodiments of the present invention, the surface 25 of the cold trap 24 may be a cleanable surface coated with chemicals for interacting with ablated materials, adhesive materials, and/or a surface maintained at a lower temperature than the material layers so as to condense ablated materials on the surface. The surface 25 may also be a disposable surface. For example, in FIG. 8 a cold trap 24 having a surface 25 oriented toward the material layer 12, will trap the ablated material on its surface and prevent it from escaping and re-depositing elsewhere on the material layer 12. This cold trap 24 is essentially a transparent sheet placed over the material layer 12. The beams travel through the sheet to ablate material that then re-deposits on the sheet, trapping the ablated material.

Figure 9:
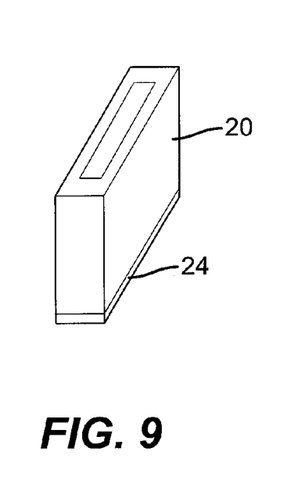
FIG. 9 is a perspective view of an alternative embodiment of the present invention having head with a trap located over the beam orifice.
Figure 10:
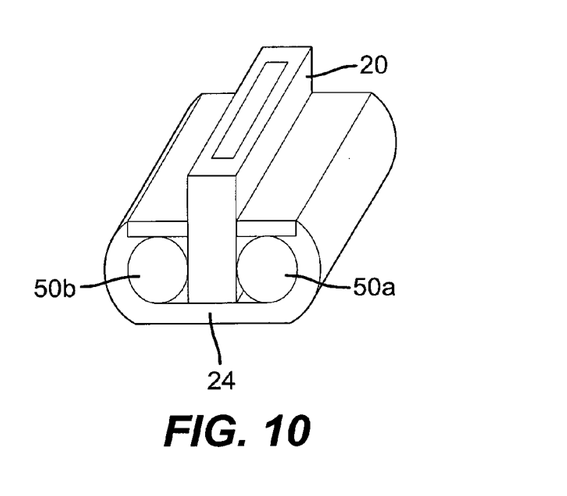
FIG. 10 is a perspective view of an alternative embodiment of the present invention having a movable trap located over the head.
Figure 11:
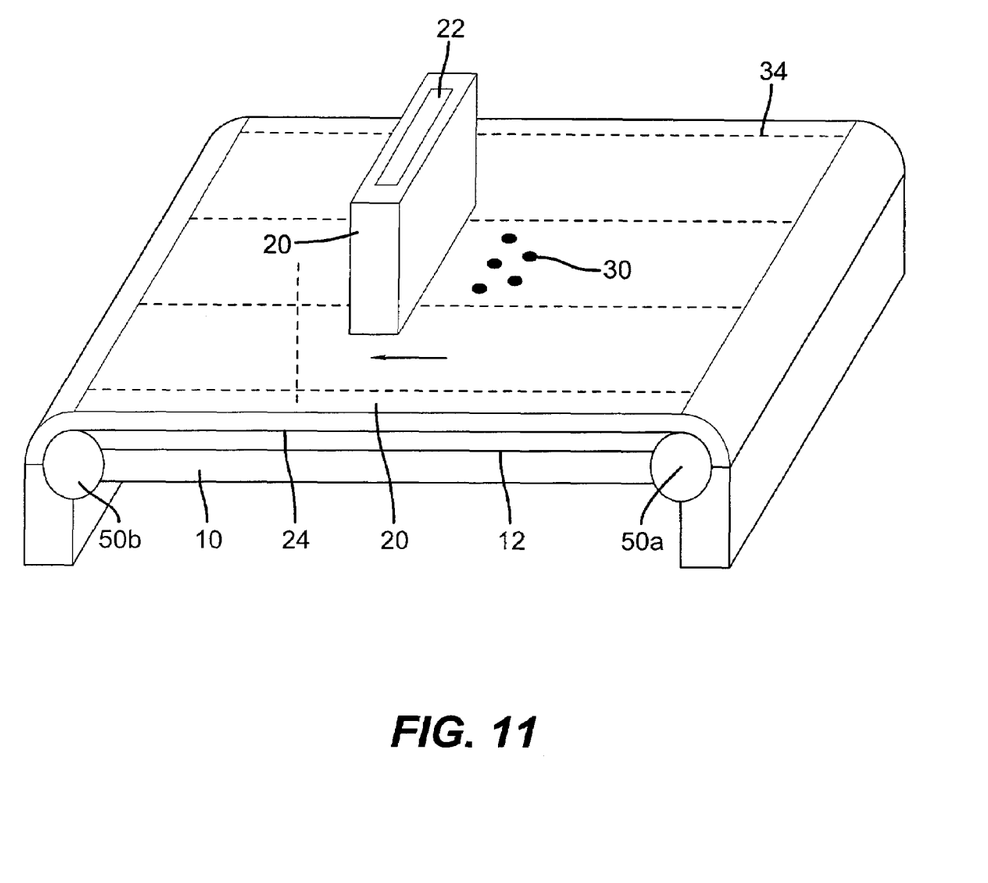
FIG. 11 is a perspective view of an alternative embodiment of the present invention having a movable trap located over the substrate and material layers.

According to the present invention, this approach has a variety of embodiments. Referring to FIG. 9, the cold trap 24 is placed over the head 20 and travels with it. When the cold trap 24 is sufficiently covered with ablated material, it may be replaced. Alternatively, as shown in FIG. 10, the cold trap may comprise a roll of sheet material that is moved over the head 20 from roller 50a to roller 50b so that a fresh, clean portion of the sheet is used as the head 20 moves across the material layers 12. In yet another alternative, referring to FIG. 11, the roll of sheet material comprising the cold trap 24 is associated with the substrate 10 and moves independently of the head 20.

In an additional embodiment of the present invention, the beam may be a beam of particles, for example comprising particles suspended in a compressed fluid wherein the particles become free of the compressed fluid prior to contact with the material layer. Such a beam, together with control mechanisms, is described in commonly assigned U.S. Pat. No. 6,692,094 in its entirety, which is hereby incorporated by reference. A plurality of such beams may be employed from a common reservoir to provide an array of beams capable of ablating layers of material in a controlled manner.

While the present invention may be employed to remove a variety of materials in one or more layers from a variety of substrates, it is anticipated that the invention may be useful in the manufacture of organic light emitting diode (OLED) devices such as displays. In this case, the layers of material to be removed may be organic materials employed in the construction of OLED devices, such as are well known in the art. Additional layers may be deposited after the vias are formed to create completed, useful devices. A process useful for the construction of OLED devices and that may employ the present invention is described in co-pending commonly assigned US Publication No. 2004/0253756, published Dec. 16, 2004, which is hereby incorporated by reference in its entirety.

The organic EL medium structure is relatively thin (for example, less than 1000 nm) and is readily selectively removed. The structure is relatively transparent but absorbs light or energy at selected wavelengths. The electrodes are typically made of a metal, metal alloy, or of a sandwich configuration of metals, and as such exhibit a level of optical reflectivity. Due to this reflectivity, the ablation process is stopped at the electrodes, thus preventing ablation beyond the removal of the organic EL medium structure. Organic EL media are known to degrade in the presence of oxygen and moisture. Therefore, it is desirable that the substrate and the suction portion be located in an inert environment. Such an environment may be composed primarily of Nitrogen, Argon, Helium or the like.

Following the selective removal of the organic EL medium structure, additional steps may be performed to complete the OLED device. For example, a second metallic layer may be deposited over the organic layer to complete the OLED structure or the OLED may be encapsulated. From the time that the first organic EL medium layers are deposited until the OLED device has been completed and the organic layers are sealed from exposure to the environment, exposure to oxygen and moisture must be avoided. For this reason, OLED devices are frequently manufactured in multi-chamber sealed environment tools. As such the laser ablation chamber of the present invention is preferably capable of receiving and returning the OLED device substrate to the sealed-environment manufacturing tool.

Figure 12:
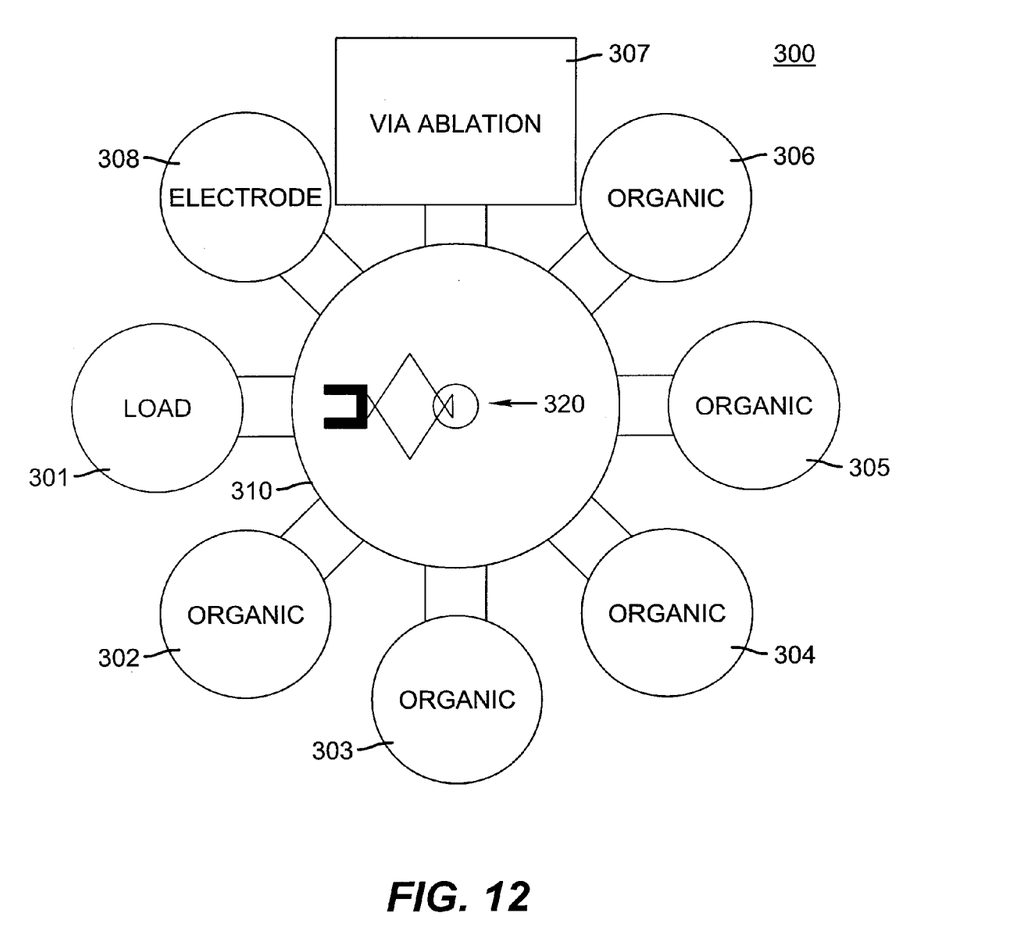
FIG. 12 is an illustration of a manufacturing tool for producing OLED devices according to an embodiment of the present invention.

A manufacturing tool 300 incorporating an ablation system, according to one embodiment of the present invention, is shown in FIG. 12. This tool is configured to receive substrates by means of a load chamber 301. The load chamber removes any oxygen or moisture-containing environment by a vacuum pumping means (not shown) known in the art. The environment is maintained at a reduced pressure or replaced with an inert environment. The substrate is then moved from the load chamber into a transfer chamber 310 by a substrate movement apparatus 320. This substrate movement apparatus may for example be a robotic arm. The substrate is then moved into one or more organic deposition chambers such as organic deposition chamber 302, organic deposition chamber 303, organic deposition chamber 304, organic deposition chamber 305, and organic deposition chamber 306 where the multiple organic layer are deposited. Following deposition of the organic layers, the substrate is moved into the via ablation chamber 307 which contains the suction portion and where the substrate is exposed to the beam portion for selective removal of the organic layers. The ablation chamber may comprise suction ports and beam ports as previously described. Upon completion of the selective removal, the substrate is then moved to the electrode deposition chamber 308 for deposition of a metal layer. Additional chambers (not shown) for encapsulation may also be provided. The substrate is then removed by means of the load chamber 301 or a similar additional chamber (not shown). This configuration whereby each process chamber is connected by one or more transfer chambers is referred to as a cluster manufacturing tool configuration. Alternately, each chamber for subsequent process steps may be arranged to connect to one another so that the substrate is passed directionally from one chamber to the next in the desired order of the process steps without the need for a transfer chamber. Such an alternate configuration is referred to as an in-line manufacturing tool configuration. In order for each chamber to be operated at different pressures, it is preferable that each chamber is separated from the transfer chamber or from other connected chambers by a gate valve that opens during substrate transfers and is capable of being closed during processing.

The invention has been described in detail with particular reference to certain preferred embodiments thereof, but it will be understood that variations and modifications can be effected within the spirit and scope of the invention. It will be understood that the method of the present invention is applicable for different classes of OLED devices such as polymer OLED devices (either active- or passive-matrix), top-emitting passive-matrix OLED devices, and top-emitting active-matrix OLED devices.

| PARTS LIST | |
|---|---|
| 10 | substrate |
| 12, 12a, 12b | layer of material |
| 16 | array of beams |
| 18 | beam-forming device |
| 20 | head |
| 20a | beam portion |
| 20b | trap portion |
| 21a, 21b | bi-directional head |
| 22 | beam port |
| 23 | arrow |
| 24, 24a, 24b | trap |
| 25 | surface |
| 26 | fiber cable |
| 30 | vias |
| 32 | ablated material |
| 34 | swathe |
| 40 | metal electrode |
| 40 | material layer |
| 50 | chamber |
| 50a, 50b | roller |
| 300 | manufacturing tool |
| 301 | load chamber |
| 302 | organic deposition chamber |
| 303 | organic deposition chamber |
| 304 | organic deposition chamber |
| 305 | organic deposition chamber |
| 306 | organic deposition chamber |
| 307 | ablation chamber |
| 308 | electrode deposition chamber |
| 310 | transfer chamber |
| 320 | substrate movement apparatus |

The invention claimed is:

1. A method of making an OLED device comprising the steps of:
    a) providing a substrate;
    b) forming one or more first electrode and electrode busses on the substrate;
    c) forming one or more organic layers over the first electrodes and electrode busses;
    d) ablating a plurality of areas of the material layer for forming vias using at least one beam in a chamber; and
    e) collecting the ablated material with a cold trap having a trap, wherein said cold trap is located in close proximity to said plurality of areas at the time of ablation so that a collection force is applied to the debris formed during ablation of said material.

2. The method of claim 1 wherein said at least one beam and said cold trap are provided in a chamber.

3. The method of claim 2 wherein said chamber includes an inert atmosphere.

4. The method of claim 3 wherein said atmosphere is nitrogen, argon, helium or carbon dioxide.

5. The method of claim 3 wherein said atmosphere flows across the surface of the material layers.

6. The method of claim 1 wherein said cold trap comprises at least one orifice(s).

7. The method of claim 6 wherein the at least one orifice comprises an array of orifices and each orifice is located adjacent each beam.

8. The method of claim 6 wherein said orifice is a single orifice.

9. The method of claim 1 wherein at least one or more beams and said cold trap are formed in an integral head.

10. The method of claim 9 wherein a portion of said head is heated and includes said one or more beams.

11. The method of claim 9 wherein a portion of the head that comprises said cold trap is cooled.

12. The method of claim 9 wherein said cold trap includes at least one orifice on either side of the array of directed beams.

13. The method of claim 9 wherein said integral can move bi-directional.

14. The method of claim 1 wherein the at least one beam comprises at least one optical beam.

15. The method of claim 14 wherein the at least one optical beam is a laser beam.

16. The method of claim 14 wherein the at least one beam each include an optical element for focusing light on the layer.

17. The method of claim 14 wherein said optical beams comprise one of the following: ultraviolet, infrared, or visible light.

18. The method of claim 14 further comprising a substrate on which said one or more layers are provided, wherein the substrate is transparent so as to permit the frequency of optical beam radiation and the optical beam radiation to travel through the substrate and the cold trap is located on the opposite side of said substrate from the at least one optical beam.

19. The method of claim 1 wherein the at least one beam moves with respect to the one or more layers.

20. The method of claim 1 wherein said cold trap includes a trap that moves with respect to the substrate and material layer and in alignment with the beams.

21. The method of claim 20 wherein said substrate is oriented vertically and the direction of motion of the cold trap is substantially vertical.

22. The method of claim 1 wherein the at least one beam comprises a beam of particles.

23. The method of claim 22 wherein said particles are suspended in a compressed fluid wherein the particles become free of the compressed fluid prior to contact with the material layer.

24. The method of claim 1 wherein said substrate and cold trap are oriented vertically.

25. The method of claim 1 wherein said substrate is oriented horizontally with the substrate above the material layer.

26. The method of claim 1 wherein said material is organic material.

27. The method of claim 26 wherein said layers form an organic light emitting diode.

28. The method of claim 1 wherein the at least one beam is independently controlled.

29. The method of claim 1 wherein said method is provided in a cluster manufacturing tool configuration.

30. The method of claim 1 wherein said method is provided in an in-line manufacturing tool configuration.

31. The method of claim 1 further comprising a chamber containing the substrate and wherein the beams pass through a window in the chamber.

* * * * *